United States Patent
Ahn (10) Patent No.: US 7,221,715 B2
(45) Date of Patent: May 22, 2007

(54) TIMING RECOVERY DEVICE

(75) Inventor: Keun Hee Ahn, Incheon-si (KR)

(73) Assignee: LG Electronics Inc., Seoul (KR)

( * ) Notice: Subject to any disclaimer, the term of this patent is extended or adjusted under 35 U.S.C. 154(b) by 734 days.

(21) Appl. No.: 10/372,217

(22) Filed: Feb. 25, 2003

(65) Prior Publication Data

US 2003/0161393 A1   Aug. 28, 2003

(30) Foreign Application Priority Data

Feb. 27, 2002   (KR)   ............ 10-2002-10562

(51) Int. Cl.
*H04L 25/49*   (2006.01)
*H04L 27/00*   (2006.01)
*H03D 3/24*   (2006.01)

(52) U.S. Cl. .............. 375/294; 375/326; 375/376
(58) Field of Classification Search ........... 375/294, 375/326, 373, 376; 348/536; 331/2; 713/400
See application file for complete search history.

(56) References Cited

U.S. PATENT DOCUMENTS

| 5,872,818 | A | * | 2/1999 | Choi ................. 375/355 |
| 6,160,443 | A | * | 12/2000 | Maalej et al. ........ 329/304 |
| 6,198,780 | B1 | * | 3/2001 | Kang ................. 375/321 |
| 6,882,373 | B2 | * | 4/2005 | Hong et al. ........... 348/726 |
| 2002/0145680 | A1 | * | 10/2002 | Hong ................. 348/725 |

* cited by examiner

*Primary Examiner*—Khai Tran
*Assistant Examiner*—Aslan Ettehadieh
(74) *Attorney, Agent, or Firm*—Harness, Dickey & Pierce, P.L.C.

(57) ABSTRACT

Timing recovery device for recovering a symbol clock from a received broadcasting signal, wherein a sign is used as a timing error, which is extracted from a result of multiplication of a difference of two symbol samples and an intermediate sample thereof, thereby very great average gain with respect to the timing error, that shortens a time period required for capturing the timing error. Particularly, since the very great average gain is obtainable even in a case a 0 dB presents, the timing offset can be captured at a short time period.

17 Claims, 8 Drawing Sheets

TIMING RECOVERY DEVICE

This application claims the benefit of the Korean Application No. P2002-10562 filed on Feb. 27, 2002, which is hereby incorporated by reference.

BACKGROUND OF THE INVENTION

1. Field of the Invention

The present invention relates to digital TV receivers, and more particularly, to a timing recovery device in a digital TV receiver which recovers a symbol clock of a received data.

2. Background of the Related Art

Recent digital TV broadcastings are made according to own transmission systems and standards of the USA, Europe, and Japan. For an example, the USA employs a VSB (Vestigial Side Band) type transmission format, an MPEG video compression format, and an AC-3 audio compression format.

For transmission of a data compressed according to above standards, synchronization signals are inserted into the data at fixed intervals, and a receiver, such as a digital TV receiver, is required to generate a clock identical to the synchronization signal used at the time of transmission for recovery of the data. A part that serves to generate such a clock at the digital TV receiver is a timing recovery part. That is, the timing recovery part reproduces a clock of a symbol stream, and a purpose of the timing recovery lies on correct and accurate prediction of a symbol transition point at the digital TV receiver based on a received data stream.

Figure 1:
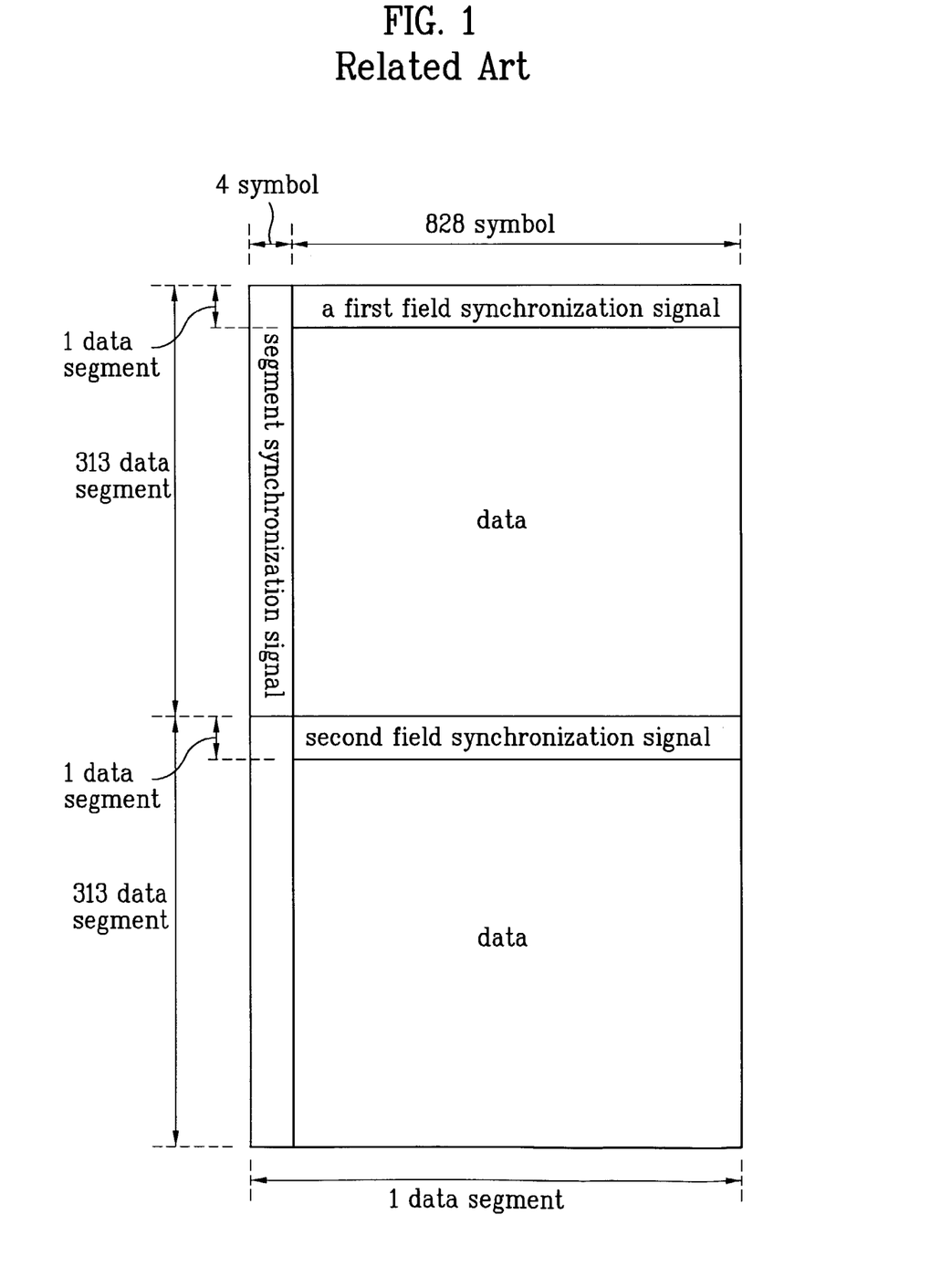
FIG. 1 illustrates a data frame received at a related art digital TV receiver.

A data frame transmitted to a related art digital TV receiver will be described. As shown in FIG. 1, there are two synchronization signals used in data transmission; one is a data segment synchronization signal, and the other one is a field synchronization signal. The data segment synchronization signal, the field synchronization signal, and the data form a unit frame of 313 data segments each with 4 symbols of data segment synchronization signals, and 828 symbols of data.

Figure 2:
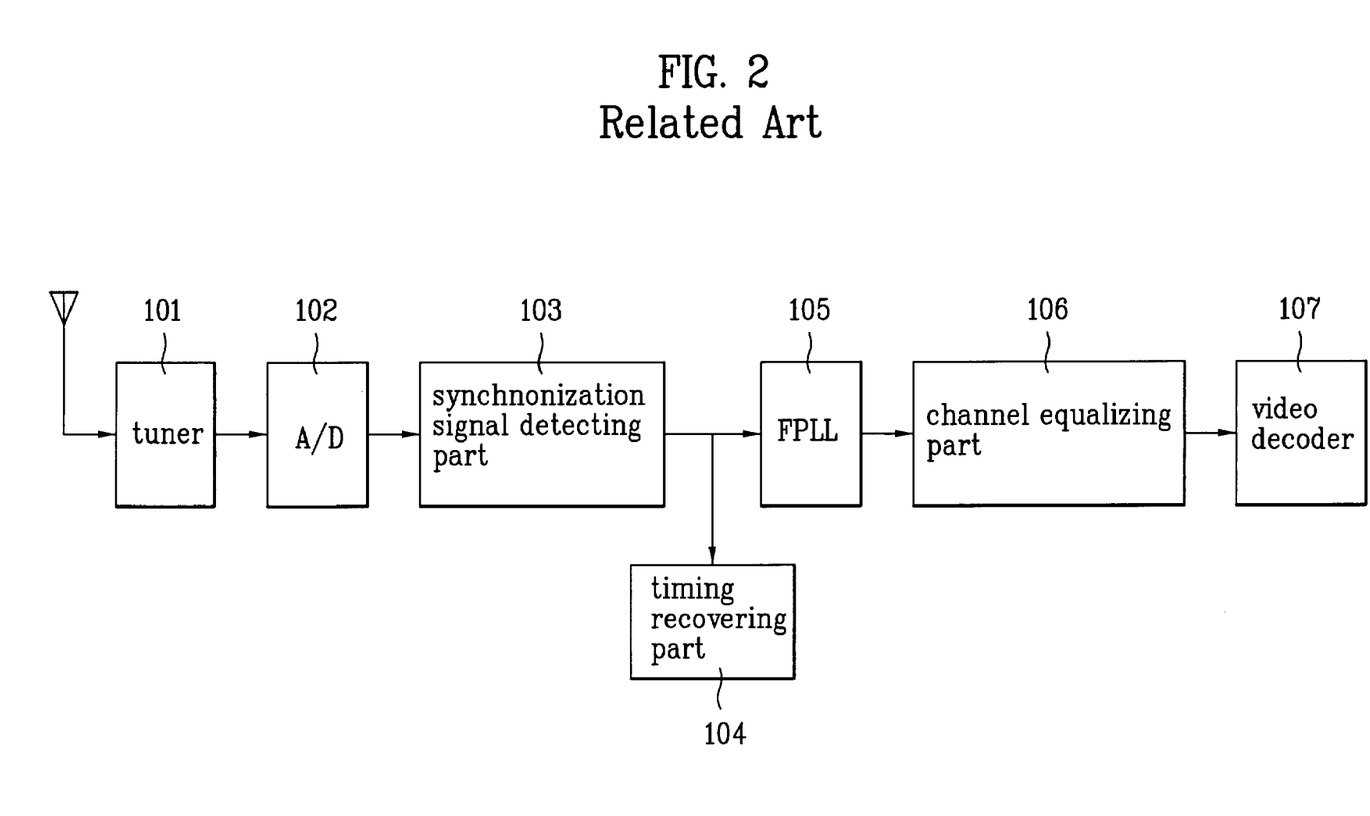
FIG. 2 illustrates a block diagram of a related art digital TV receiver.

The foregoing data is displayed on the digital TV receiver according to the following sequence. As shown in FIG. 2, upon reception of a broadcasting signal having the data through an antenna, a tuner 101 selects a frequency of a specific channel, and converts the frequency into an IF signal, and the IF signal is converted into a digital data through an analog/digital converting part A/D 102.

Then, the IF signal converted into the digital data is provided to a synchronization signal detecting part 103, which detects the data segment synchronization signal and the field synchronization signal inserted at the time of transmission from the digital IF signal.

For recovering the data by using the signals from the synchronization signal detecting part 103, the timing recovering part 104 recovers the timing of the synchronization signal used at the time of transmission. That is, the timing recovering part 104 recovers the timing to be applied to an A/D clock of the A/D converting part 102 by using the data segment synchronization signal.

Then, an FPLL (Frequency Phase Locked Loop) 105 demodulates the digital IF signal into a base band I signal and a base band Q signal. The Q signal is used in recovery of a carrier. Then, a channel equalizing part 106 removes errors, such as ghost, and the like, from the signal from the FPLL 105, and a video decoder 107 decodes, and displays a signal from the channel equalizing part 106 on a screen.

In a case that the timing is recovered by using the data segment synchronization signal, a phase error is erased because the timing is recovered in a state in which recovery of the carrier is not finished yet, i.e., in a state in which the phase error of the signal is present still.

Moreover, the related art timing recovering part requires a long time period for detecting the timing error because a segment synchronization section can not be known when the ghost is present. Eventually, compensation for the timing error is delayed as much, resulting in a vicious circle of failing detection of a proper data segment synchronization signal.

SUMMARY OF THE INVENTION

Accordingly, the present invention is directed to a timing recovery device that substantially obviates one or more of the problems due to limitations and disadvantages of the related art.

An object of the present invention is to provide a timing recovery device which can capture a timing offset from an average gain of a timing error detecting part within a short time even if a 0 dB ghost presents.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the timing recovery device includes a filter for passing edges of spectrums of broadcasting signals sampled at fixed intervals at a re-sampling part, a timing error detecting part for obtaining two symbol sample from a signal from the filter and an intermediate sample thereof, and detecting information on a timing error from a result (a value) of multiplication of a difference of the two samples and the intermediate sample, a loop filter for providing a signal of a bandwidth according to a signal from the timing error detecting part, and an NCO for controlling a sampling timing of the re-sampling part in response to a signal from the loop filter.

The timing error detecting part includes a first delay for delaying a received symbol sample by one clock, a second delay for further delaying a signal from the first delay by one clock, a subtractor for providing a difference of signals from the pre-filter and the second delay, a multiplier for multiplying signals from the first delay and the subtractor, and a sign extractor for extracting a sign which is a timing error value from a signal from the multiplier, or alternatively, the timing error detecting part includes a first delay for delaying an I signal symbol sample by one clock, a second delay for further delaying a signal from the first delay by one clock, a first subtractor for providing a difference of an I signal symbol sample and a signal from the second delay, a first multiplier for multiplying signals from the first delay and the first subtractor, a third delay for delaying a Q signal symbol sample by one clock, a fourth delay for further delaying a signal from the third delay by one clock, a second subtractor for providing a difference of a Q signal symbol sample and a signal from the fourth delay, a second multiplier for multiplying signals from the third delay and the second subtractor, a third subtractor for providing a difference of signals from the first and second multipliers, and a sign extractor for extracting only a sign from the third subtractor.

The loop filter includes a first bandwidth forwarding part for selectively forwarding one of first positive bandwidth values and first negative bandwidth values in response to a signal from the timing error detecting part, a second bandwidth forwarding part for selectively forwarding one of second positive bandwidth values and second negative bandwidth values in response to the signal from the timing error detecting part, a first adder for adding a signal from the first bandwidth forwarding part to a signal fed back from a delay at a next stage, and a second adder for adding a signal from the first bandwidth forwarding part to a signal from the first adder. The first or the second bandwidth forwarding part includes a first storing part for storing positive bandwidth values, a first multiplexer for selectively providing one of the positive bandwidth values in response to a switching signal, a second storing part for storing negative bandwidth values, a second multiplexer for selectively providing one of the negative bandwidth values in response to the switching signal, and a third multiplexer for selectively providing one of signals from the first and second multiplexers in response to a signal from the timing error detecting part.

In another aspect of the present invention, there is provided a timing recovery device including a filter for passing components of a broadcasting signal sampled at fixed intervals by a re-sampling part, the component containing timing information only, a timing error detecting part for detecting a polarity form timing error value having a positive (+) or a negative value from a signal from the filter, a loop filter for selectively providing a signal of a specific bandwidth of a plurality of bandwidths according to a signal from the timing error detecting part, and an NCO for controlling a sampling timing of the re-sampling part in response to a signal from the loop filter.

The timing error detecting part includes a first delay for delaying an I signal symbol sample from the filter by one clock, a second delay for further delaying a signal from the first delay by one clock, a subtractor for providing a difference of signals between the I signal symbol sample and a signal from the second delay, a multiplier for multiplying signals from the first delay and the subtractor, and a sign extractor for extracting a polarity form timing error value from a signal having a positive (+) or negative (−) polarity from the multiplier, or alternatively the timing error detecting part includes a first delay for delaying an I signal symbol sample from the filter by one clock, a second delay for further delaying a signal from the first delay by one clock, a first subtractor for providing a difference of an I signal symbol sample and a signal from the second delay, a first multiplier for multiplying signals from the first delay and the first subtractor, a third delay for delaying a Q signal symbol sample from the filter by one clock, a fourth delay for further delaying a signal from the third delay by one clock, a second subtractor for providing a difference of a Q signal symbol sample and a signal from the fourth delay, a second multiplier for multiplying signals from the third delay and the second subtractor, a third subtractor for providing a difference of signals from the first and second multipliers, and a sign extractor for extracting a polarity form timing error having a positive (+) or a negative (−) polarity from a signal from the third subtractor.

The loop filter accumulates and provides a positive bandwidth signal if the signal from the timing error detecting part is positive (+), and a negative bandwidth signal if the signal from the timing error detecting part is negative (−).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

Figure 3:
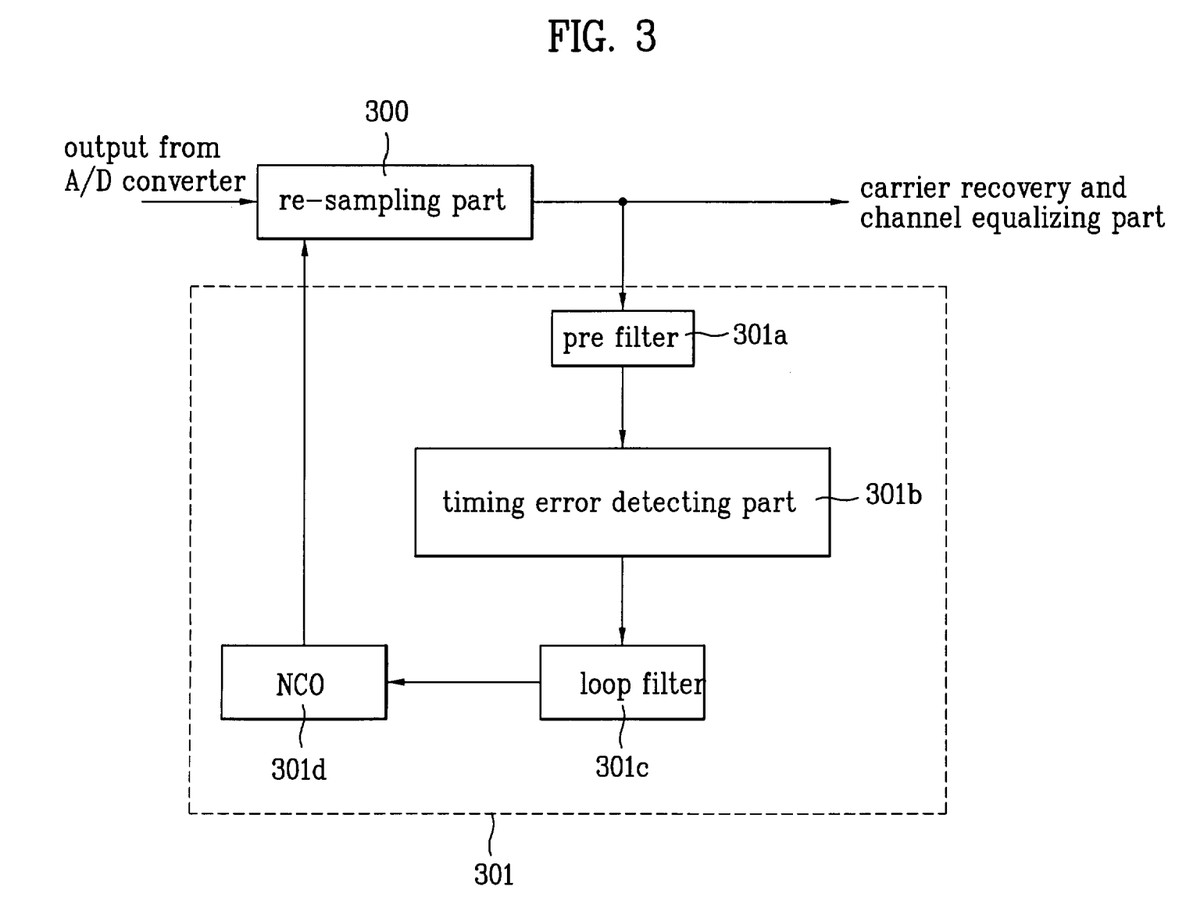
FIG. 3 illustrates a block diagram of a timing recovery device in accordance with a preferred embodiment of the present invention.

When broadcasting signals are received through an antenna, after a frequency of specific channel is selected by a viewer, a broadcasting signal of a selected channel is converted into a digital data through an analog/digital converting part A/D (not shown). Then, the broadcasting converted into a digital data is provided to a re-sampling part 300. The re-sampling part 300 samples the broadcasting signal at fixed intervals, and a signal from the re-sampling part 300 is provided to a carrier recovery part (not shown) or a channel equalizing part (not shown). The signal from the re-sampling part 300 is provided to the re-sampling part 300 through the timing recovery device 301.

FIG. 3 illustrates a block diagram of a timing recovery device in accordance with a preferred embodiment of the present invention, including a pre-filter 301a for passing a band of a signal from the re-sampling part 300, a timing error detecting part 301b of the Gardner type for detecting a timing error from a signal from the pre-filter 301a, a loop filter 301c for passing a low band component of the signal from the timing error detecting part 301b, and a numerically controlled oscillator (NCO) 301d for changing a frequency to be provided in response to a signal from the loop filter 301c, and controlling a sampling timing of the re-sampling part 300.

The pre-filter 301a only passes edges of spectrums of a broadcasting signal received at the digital TV receiver, because the edge contains information on the timing of the broadcasting signal.

Figure 4:
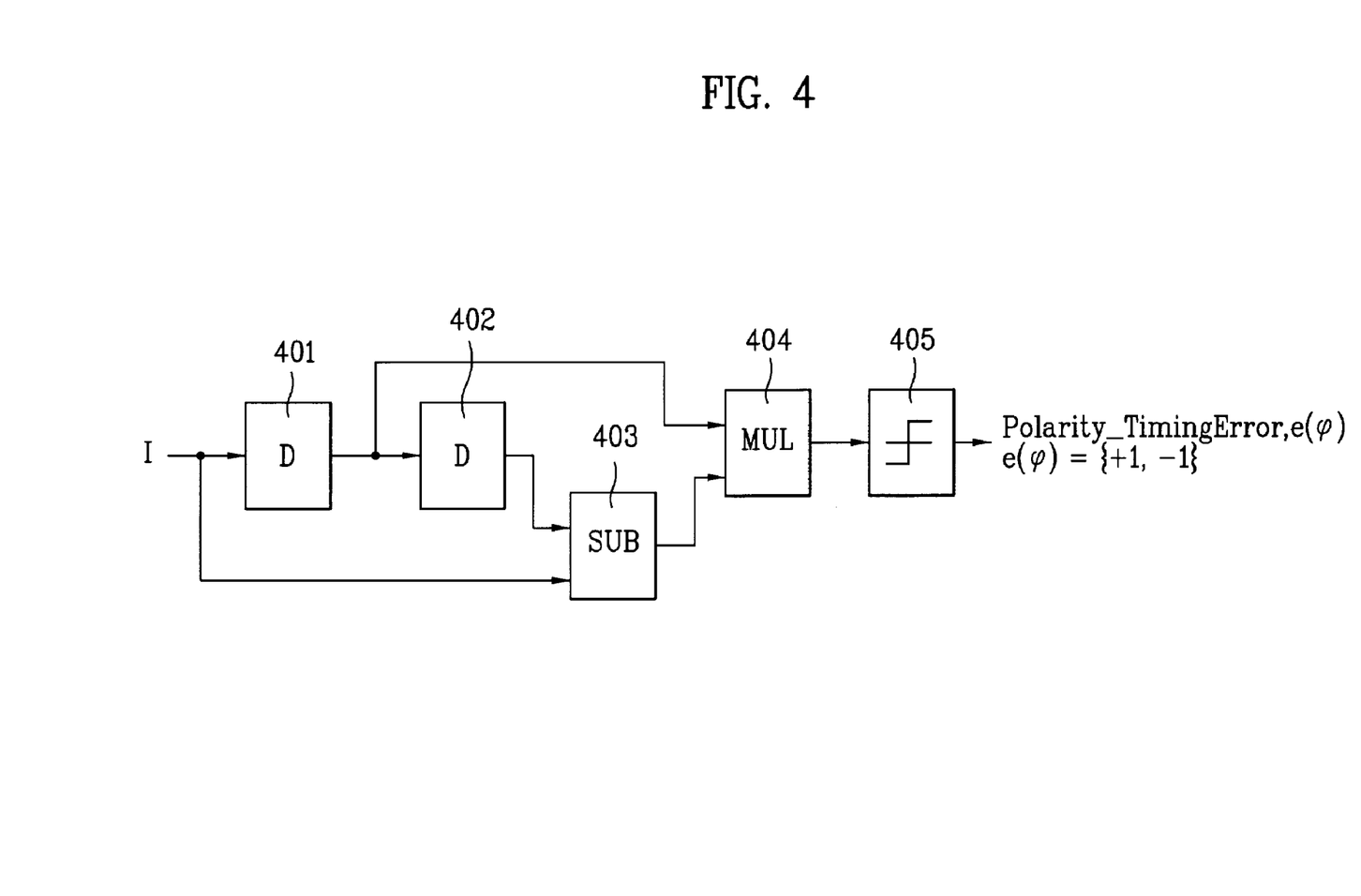
FIG. 4 illustrates a block diagram of one embodiment of a timing error detecting part by using an I signal in the timing recovery device of the present invention.

FIG. 4 illustrates a first embodiment timing error detecting part 301b, including a first delay 401 for delaying an I signal symbol sample from the pre-filter 301a by one clock, a second delay 402 for delaying a signal from the first delay by one clock, a subtractor 403 for providing a difference of signals from the pre-filter 301a and the second delay 401, a multiplier 404 for multiplying signals from the first delay 401 and the subtractor 403, and a sign extractor 405 for extracting a sign which is a timing error value from a signal from the multiplier 404.

When the I signal symbol sample is provided to the first delay 401, the first delay 401 delays the I signal symbol sample for one clock and provides to the second delay 402 and the multiplier 404. The symbol sample that was delayed for one clock is further delayed for one clock at the second delay 402, and provided to the subtractor 403.

Then, the subtractor 403 calculates a difference of the symbol sample from the pre-filter 301a and the two clock delayed symbol sample from the second delay 402, and provides to the multiplier 404.

The multiplier 404 multiplies the one clock delayed symbol sample from the first delay 401 and a signal from the subtractor 403, and provides to the sign extractor 405. The sign extractor 405 extracts a sign representing only a polarity of the signal from the multiplier 404, and provides to the loop filter 301c. The sign extractor 405 provides a signal indicating one of −1, 0, or +1.

Thus, the timing error detecting part 301b multiplies (A) a difference of two symbol samples and (B) an intermediate symbol sample that is intermediate relative to the two symbol samples, and extracts a sign from a result of the multiplication. The extracted sign is used as a timing error value.

The operation of the timing error detecting part 301b can be expressed as the following equation.

$$U_\tau(k) = \text{sign}[x(\tau - T/2 + kT)\{x(\tau + kT), -x(\tau - T + kT)\}] \quad (1)$$

where, $\tau$: timing phase, $x(\tau + kT), x(\tau T + kT)$: symbol samples, and $x(\tau - T/2 + kT)$: intermediate samples.

Figure 5:
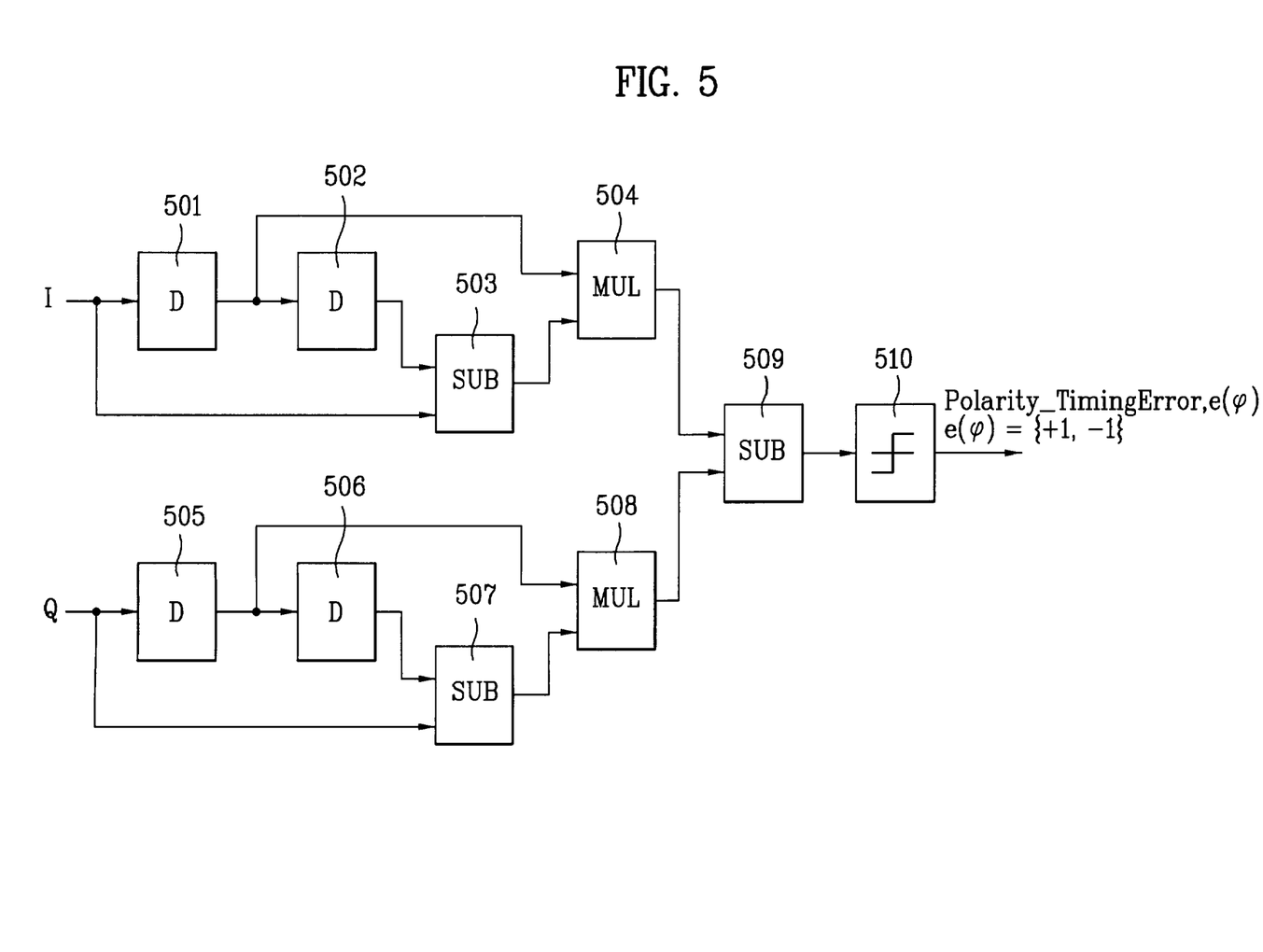
FIG. 5 illustrates a block diagram of one embodiment of a timing error detecting part by using I and Q signals in the timing recovery device of the present invention.

FIG. 5 illustrates a block diagram of a second embodiment of a timing error detecting part, for, different from the first embodiment, detecting a timing error by using I, and Q signals.

Referring to FIG. 5, the second embodiment timing error detecting part 301b multiplies a difference of two symbol samples and an intermediate sample value of the two symbol samples to I, and Q signals, respectively.

That is, upon reception of an I signal symbol sample, the first delay 501 delays the symbol sample for one clock, and provides to a second delay 502 and a first multiplier 504. The symbol sample delayed for one clock is further delayed for one clock at the second delay 502, and provided to the first subtractor 503. Then, the subtractor 503 calculates a difference of the I signal symbol sample and the symbol sample delayed for two clocks from the second delay 502, and provides to the first multiplier 504. The first multiplier 504 multiplies the one clock delayed symbol sample from the first delay 501 and a signal from the first subtractor 503.

Upon reception of a Q signal symbol sample, the third delay 505 delays the Q signal symbol sample for one clock, and provides to the fourth delay 506 and the second multiplier 508. The symbol sample delayed for one clock is further delayed for one clock at the fourth delay 506 and provided to the second subtractor 507. Then, the second subtractor 507 calculates a difference of the Q signal symbol sample and the two clock delayed symbol sample from the fourth delay 508, and provides to the second multiplier 508. The second multiplier 508 multiplies the one clock delayed symbol sample from the third delay 505 and a signal from the second subtractor 507.

Then, a second subtractor 509 calculates a difference of signals from the first multiplier 504 and the second multiplier 508, and provides the difference to the sign extractor 510. The sign extractor 510 extracts a sign of the difference, and provides as a timing error value of a polarity form.

As described, because the timing error detecting part 301b of the present invention detects a polarity form of timing error, an average gain of the timing errors are significantly greater than a related art timing error detecting part. Moreover, as shown in FIG. 4, the timing error can be obtained by using the I signal only, or as shown in FIG. 5 the timing error can be obtained by using both the I and Q signals. The first embodiment timing error detecting part in which only the I signal is used has a simple circuit system, and the second embodiment timing error detecting part in which only the I and Q signals are used can provide a more accurate timing error, though a circuit system thereof is complicated.

Figure 6:
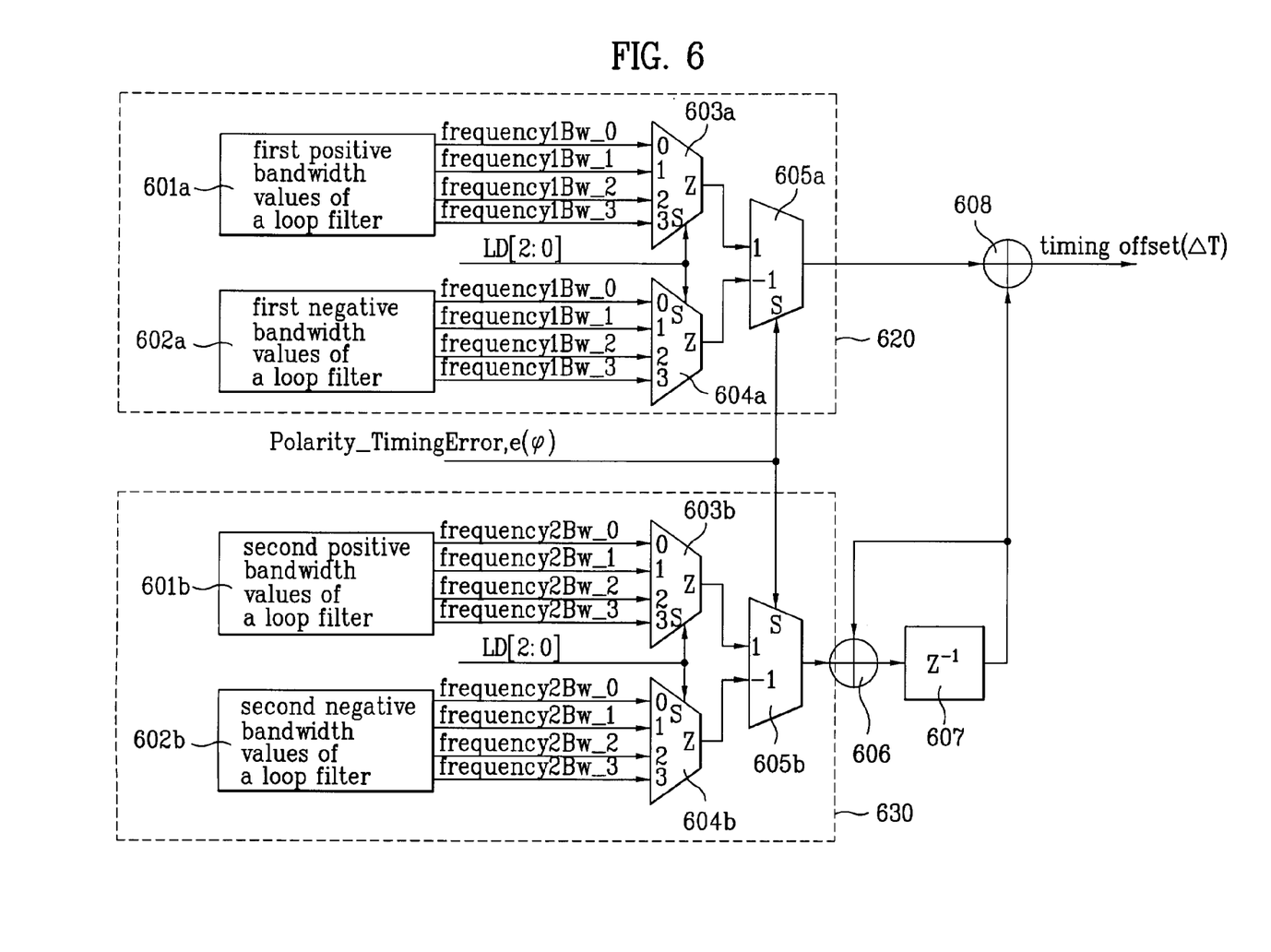
FIG. 6 illustrates a detailed block diagram of a loop filter in the timing recovery device of the present invention.

FIG. 6 illustrates a detailed block diagram of one embodiment of a loop filter 301c which fixes a loop bandwidth depending on the polarity of the timing error provided by the timing error detecting part 301b.

The loop filter 301c includes a first bandwidth forwarding part 620 for selectively forwarding one of first positive bandwidth values and first negative bandwidth values, a second bandwidth forwarding part 630 for selectively forwarding one of second positive bandwidth values and second negative bandwidth values, a first adder 606 for adding a signal from the second bandwidth forwarding part 630 to a signal fed back from a delay 607, and a second adder 608 for adding a signal from the first bandwidth forwarding part 620 to a signal from the first adder 606. The loop filter 301c may include more than two of a plurality of bandwidth forwarding parts which forwards bandwidth values different from one another.

The first bandwidth forwarding part 620 includes first, and second storing parts 601a and 602a, and first, second, and third multiplexers 603a, 604a, and 605a, and the second bandwidth forwarding part 630 includes third, and fourth storing parts 601b and 602b, and fourth, fifth, and sixth multiplexers 603b, 604b, and 605b.

The first bandwidth forwarding part 620 and the second bandwidth forwarding parts 630 will be described in more detail. The first storing part 601a calculates the first positive bandwidth values Frequency1Bw_0~Frequency1Bw_for loop filter in advance and stores them therein, and the second storing part 602a calculates the first negative bandwidth values Frequency1Bw_0~Frequency1Bw_3 for the loop filter in advance and stores them therein. The first multiplexer 603a selects one of the plurality of the first positive bandwidth values stored in the first storing part 601a and forwards it to the third multiplexer 605a in response to a lock detecting signal LD[2:0] which is a switching signal, and the second multiplexer 604a selects one of the plurality of the first negative bandwidth values stored in the second storing part 602a and forwards it to the third multiplexer 605a in response to the lock detecting signal LD[2:0]. The third multiplexer 605a selects one of signals from the first and second multiplexers 603a and 604a and forwards it to the second adder 608 according to the polarity of the timing error value from the timing error detecting part 301c.

The third storing part 601b calculates the second positive bandwidth values Frequency2Bw_0~Frequency2Bw_3 for the loop filter in advance and stores them therein, and the fourth storing part 602b calculates the second negative bandwidth values Frequency2Bw_0~Frequency2Bw_3 for the loop filter in advance and stores them therein. The fourth multiplexer 603b selects one of the plurality of the second positive bandwidth values stored in the third storing part 601b and forwards it to the sixth multiplexer 605b in response to the lock detecting signal LD[2:0], and the fifth multiplexer 604b selects one of the plurality of the second negative bandwidth values stored in the fourth storing part 602b and forwards it to the sixth multiplexer 605b in response to the lock detecting signal LD[2:0]. The sixth multiplexer 605b selects one of signals from the fourth and fifth multiplexers 603b and 604b and forwards it to the first adder 606 according to the polarity of the timing error value from the timing error detecting part 301c. The first adder 606 adds a signal from the sixth multiplexer 605b and a value fed back from the delay 607 and provides the sum to the delay 607, and the delay 607 delays a signal from the first adder 606 by one symbol, and feeds the delayed signal back to the first adder 606 and to the second adder 608. The second adder 608 adds a signal from the third multiplexer 605a and a signal from the delay 607, and provides the sum to the NCO 301d. The first and second adders 606 and 608 and the delay 607 are of a kind of integrator, for accumulating results of the third and sixth multiplexers 605a and 605b in symbols. The gear shifting of the filter bandwidth is made automatically in response to the lock detecting signal LD[2:0].

If a polarity of the timing error (generated, again, by the timing error detecting part 301b) is positive (+1), the loop filter 301c accumulates and provides the positive bandwidth values, and, opposite to this, if a polarity of the polarity form timing error is negative (−1), the loop filter 301c accumulates and provides the negative bandwidth values. Therefore, the bandwidth value from the loop filter 301c is a constant, and a multiplexer can be employed in place of a multiplier for selection of the loop filter bandwidth value, much hardware resource can be saved. This is made possible as the timing error value is not a data form, but a polarity form.

Figure 7:
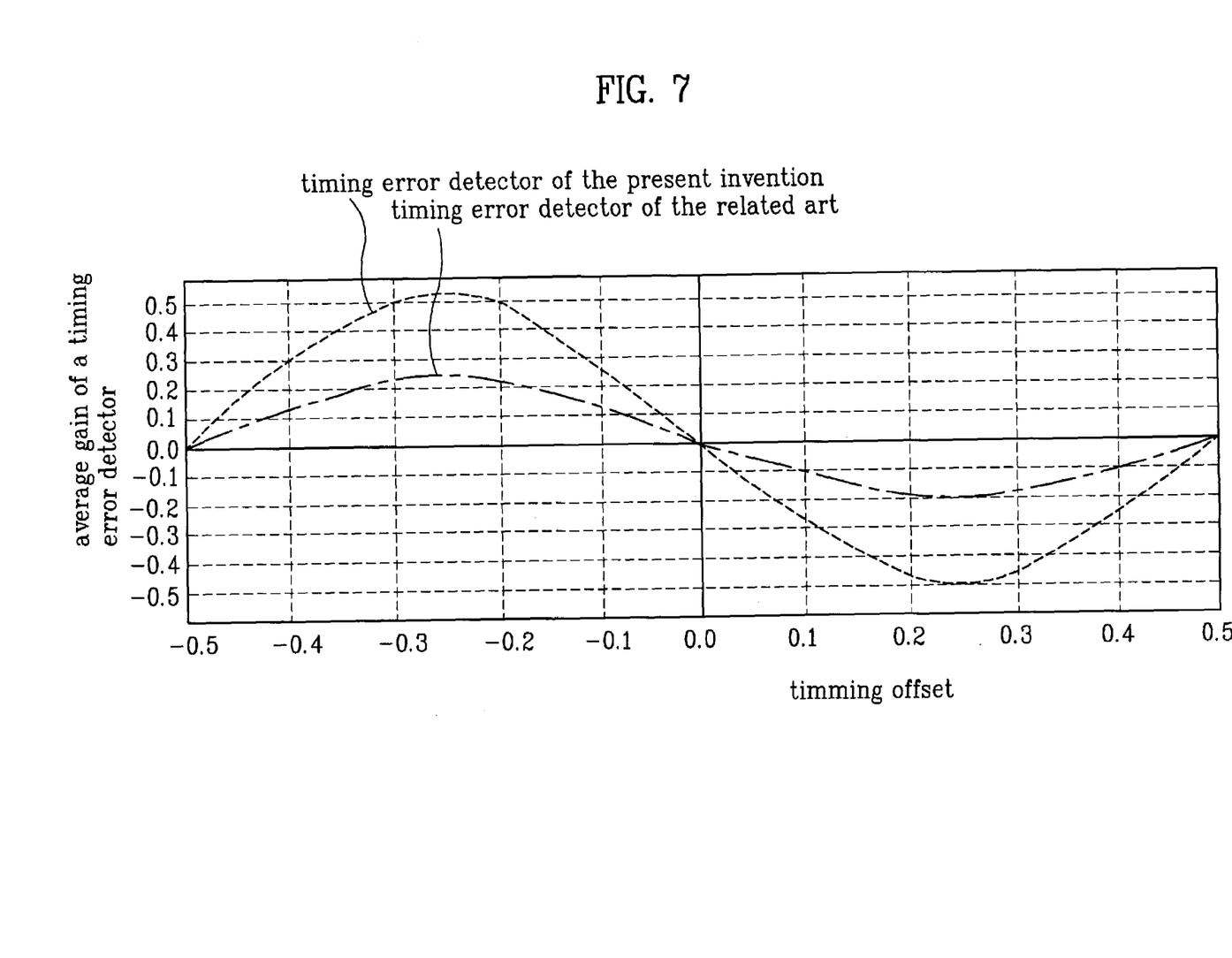
FIG. 7 illustrates an experimental graph comparing average gains of a related art timing error detecting part and a timing error detecting part of the present invention, when no ghost is present.

FIG. 7 illustrates an experimental graph comparing average gains (S curve) of a related art timing error detecting part and a timing error detecting part according to an embodiment of the present invention, when no ghost is present, wherein it can be noted that the average gain of the timing error detecting part of the present invention is greater than the related art timing error detecting part of the Gardner type by more than two times.

Figure 8:
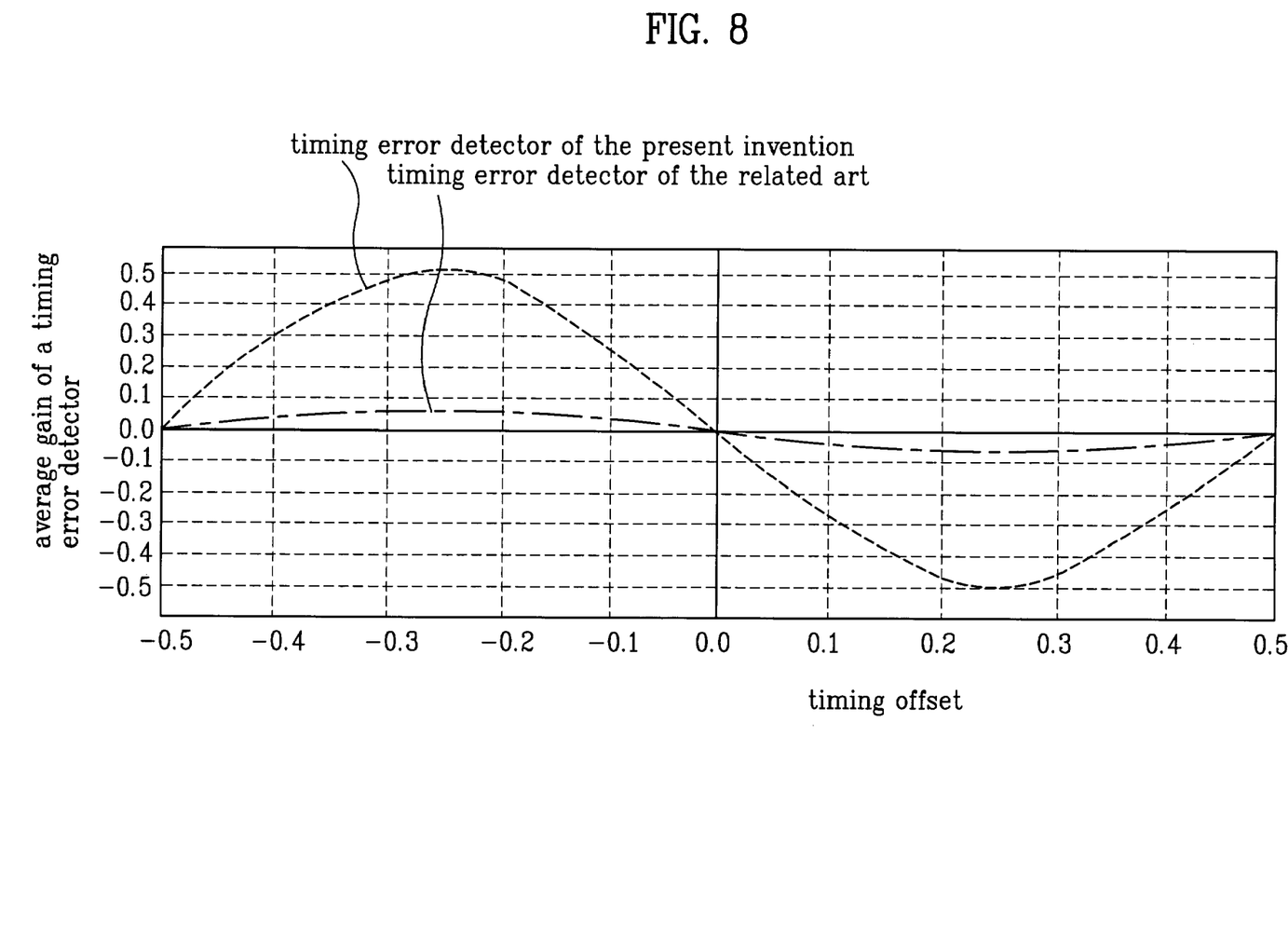
FIG. 8 illustrates an experimental graph comparing average gains of a related art timing error detecting part and a timing error detecting part of the present invention, when a 0 dB ghost is present.

FIG. 8 illustrates an experimental graph comparing average gains (S curve) of a related art timing error detecting part and a timing error detecting part according to an embodiment of the present invention, when a 0 dB ghost is present, wherein it can be noted that the average gain of the timing error detecting part of the present invention is greater than the related art timing error detecting part of the Gardner type by more than 10 times.

From the result of experiment, it can be known that the average gain of the timing error detecting part according to one or more embodiments of the present invention is excellent compared to the related art timing error detecting part, which contribute to a performance improvement of the timing recovery device in a digital TV receiver.

The present invention is applicable to communication fields including of VSB/QPSK/QAM.

The multiplication of a difference signal between two symbol samples and an intermediate sample thereof, and extracting a sign only from a result of the multiplication as a timing error, which permits to provide a very great average gain of the timing error, can shorten a time period required for capturing the timing error. Especially, since a very great gain can be obtained even in a case a 0 dB ghost is present, a timing offset can be captured within a short time period.

Since the timing error detecting part provides a polarity form timing error, hardware of loop filter can be simplified.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A timing recovery device comprising:
   a first filter for passing edges of spectrums of broadcasting signals sampled at fixed intervals at a sampling part;
   a timing error detecting part for obtaining a first symbol sample from the first filter, generating second and third symbol samples based thereon, respectively, and generating a timing error represented in the form of an integer polarity signal based upon a result of a multiplication of (A) a difference of the first and third samples and (B) the second sample;
   a loop filter for generating an oscillator control signal according to the polarity signal from the timing error detecting part; and
   an NCO for generating, according to the oscillator control signal, a sampling timing control signal and providing the same to the sampling part.

2. The timing recovery device as claimed in claim 1, wherein the timing error detecting part detects the timing error by applying the following equation thereto to determine a polarity thereof, $$U_r(k) = sgn\left[x\left(\tau - \frac{T}{2} + kT\right)\{x(\tau + kT) - x(\tau - T + kT)\}\right]$$

where, τ is a timing phase, x(k), x(τ−T+kT) are the first and third symbol samples, respectively, and $$x\left(\tau - \frac{T}{2} + kT\right):$$

is the third sample.

3. The timing recovery device as claimed in claim 1, wherein the timing error detecting part generates the third sample by delaying the first sample by two clocks and generates the second sample by delaying the first sample by one clock.

4. The timing recovery device as claimed in claim 1, wherein the timing error detecting part includes:
   a first delay for delaying the first sample by one clock to produce the second sample,
   a second delay for further delaying a signal from the first delay by one clock to produce the third sample,
   a subtractor for providing a difference of the first and third sample, a multiplier for multiplying signals from the first delay and the subtractor, and a sign extractor for extracting a sign from a signal output by the multiplier to produce the polarity signal.

5. The timing recovery device as claimed in claim 1, wherein the first sample is an I signal sample and the timing error detecting part includes;

a first delay for delaying the first sample by one clock to produce the second sample;

a second delay for further delaying a signal from the first delay by one clock to produce the third sample, a first subtractor for providing a difference of the first and third samples, a first multiplier for multiplying signals from the first delay and the first subtractor, a third delay for receiving a Q signal symbol sample from the first filter as a fourth sample and delaying the same by one clock to produce a fifth sample, a fourth delay for further delaying a signal from the third delay by one clock to produce a sixth sample, a second subtractor for providing a difference of the fourth and sixth samples, a second multiplier for multiplying signals from the third delay and the second subtractor, a third subtractor for providing a difference of signals from the first and second multipliers, and a sign extractor for extracting a sign representing a timing error value from the third subtractor.

6. The timing recovery device as claimed in claim 1, wherein the loop filter stores a plurality of bandwidth values and based thereon, respectively, selectively forwards a specific bandwidth signal in response to a signal from the timing error detecting part.

7. The timing recovery device as claimed in claim 6, wherein the loop filter forwards a positive bandwidth signal if the signal from the timing error detecting part is positive, or a negative bandwidth signal if the signal from the timing error detecting part is negative.

8. The timing recovery device as claimed in claim 1, wherein the loop filter includes;

a first bandwidth forwarding part for selectively forwarding one of first positive bandwidth values and first negative bandwidth values in response to a signal from the timing error detecting part, a second bandwidth forwarding part for selectively forwarding one of second positive bandwidth values and second negative bandwidth values in response to the signal from the timing error detecting part, a first adder for adding a signal from the second bandwidth forwarding part to a feedback signal, a delay for delaying a sum from the first adder to produce the feedback signal, and a second adder for adding the feedback signal to a signal from the first bandwidth forwarding part.

9. The timing recovery device as claimed in claim 8, wherein the first or the second bandwidth forwarding part includes:

a first storing part for storing positive bandwidth values, a first multiplexer for selectively providing one of the positive bandwidth values in response to a switching signal, a second storing part for storing negative bandwidth values, a second multiplexer for selectively providing one of the negative bandwidth values in response to the switching signal, and a third multiplexer for selectively providing one of signals from the first and second multiplexers in response to a signal from the timing error detecting part.

10. A timing recovery device comprising:

a first filter for passing components of a broadcasting signal sampled at fixed intervals by a sampling part, the component containing timing information only;

a timing error detecting part for detecting, based upon at least one of the components from the first filter, a timing error and based thereon producing an integer polarity signal having a positive (+), zero or a negative value;

a loop filter for generating an oscillator control signal according to the polarity signal from the timing error detecting part; and an NCO for generating, according to the oscillator control signal, a sampling timing control signal and providing the same to the sampling part.

11. The timing recovery device as claimed in claim 10, wherein the timing error detecting part obtains a first symbol sample from the first filter, generates second and third symbol samples based thereon, respectively, and generates the polarity signal from a result of a multiplication of (A) a difference of the first and third samples and (B) the second sample.

12. The timing recovery device as claimed in claim 10, wherein the first sample is an I signal sample and the timing error detecting part includes:

a first delay for delaying the first sample from the first filter by one clock to produce the second sample, a second delay for further delaying a signal from the first delay by one clock to produce the third sample, a subtractor for providing a difference of the first and third samples, a multiplier for multiplying signals from the first delay and the subtractor, and a sign extractor for extracting a signal having a positive (+), zero or negative (−) value from the multiplier to produce the polarity signal.

13. The timing recovery device as claimed in claim 10, wherein the first sample is an I signal sample and the timing error detecting part includes:

a first delay for delaying the first sample from the first filter by one clock to produce the second sample, a second delay for further delaying a signal from the first delay by one clock to produce the third sample, a first subtractor for providing a difference of the first and third samples, a first multiplier for multiplying signals from the first delay and the first subtractor, a third delay for receiving a Q signal symbol sample from the first filter as a fourth sample and delaying the same by one clock to produce a fifth sample, a fourth delay for further delaying a signal from the third delay by one clock to produce a sixth sample, a second subtractor for providing a difference of the fourth and sixth sample, a second multiplier for multiplying signals from the third delay and the second subtractor, a third subtractor for providing a difference of signals from the first and second multipliers, and sign extractor for extracting a signal having a positive (+), zero or a negative (−) value from a from the difference output by the third subtractor.

14. The timing recovery device as claimed in claim 10, wherein the loop filter accumulates and provides a positive bandwidth signal if the polarity signal from the timing error detecting part is positive (+), and a negative bandwidth signal if the polarity signal from the timing error detecting part is negative (−).

15. The timing recovery device as claimed in claim 10, wherein the loop filter includes;
   a first bandwidth forwarding part for selectively forwarding one of first positive bandwidth values and first negative bandwidth values in response to a signal from the timing error detecting part,
   a second bandwidth forwarding part for selectively forwarding one of second positive bandwidth values and second negative bandwidth values in response to the signal from the timing error detecting part,
   a first adder for adding a signal from the second bandwidth forwarding part to a feedback signal,
   a delay for delaying a sum from the first adder to produce the feedback signal, and
   a second adder for adding the feedback signal to a signal from the first bandwidth forwarding part.

16. The timing recovery device as claimed in claim 15, wherein the first or second bandwidth forwarding part selectively forwards one of positive bandwidth values if the polarity signal from the timing error detecting part is positive (+), and one of negative bandwidth values if the polarity signal from the timing error detecting part is negative (−).

17. The timing recovery device as claimed in claim 15, wherein the first or the second bandwidth forwarding part includes:
   a first storing part for storing positive bandwidth values;
   a first multiplexer for selectively providing one of the positive bandwidth values in response to a switching signal,
   a second storing part for storing negative bandwidth values,
   a second multiplexer for selectively providing one of the negative bandwidth values in response to the switching signal, and
   a third multiplexer for selective providing one of signals from the first and second multiplexers in response to a signal from the timing error detecting part.

* * * * *